United States Patent
Hoffman et al.

(10) Patent No.: US 8,425,738 B2
(45) Date of Patent: Apr. 23, 2013

(54) METHOD FOR DEPOSITING OF BARRIER LAYERS ON A PLASTIC SUBSTRATE AS WELL AS COATING DEVICE THEREFOR AND A LAYER SYSTEM

(75) Inventors: Gerd Hoffman, Bruchkoebel (DE); Alexandra L. Quiceno, Cartagena (CO)

(73) Assignees: Applied Materials, Inc., Santa Clara, CA (US); Biofilm S.A., Puerto Industrial-Altamiro-Tamaulipas (MX)

( * ) Notice: Subject to any disclaimer, the term of this patent is extended or adjusted under 35 U.S.C. 154(b) by 461 days.

(21) Appl. No.: 12/418,130

(22) Filed: Apr. 3, 2009

(65) Prior Publication Data

US 2009/0324972 A1    Dec. 31, 2009

Related U.S. Application Data

(60) Provisional application No. 61/042,387, filed on Apr. 4, 2008.

(30) Foreign Application Priority Data

Apr. 4, 2008  (EP) ..................................... 08103386
Apr. 29, 2008 (EP) ..................................... 08155403

(51) Int. Cl.
  *C23C 14/34* (2006.01)
(52) U.S. Cl.
  USPC ............ 204/192.23; 204/192.15; 204/192.38; 204/192.22; 204/298.24
(58) Field of Classification Search ............. 204/192.22, 204/192.23, 192.15, 192.38, 298.24
  See application file for complete search history.

(56) References Cited

U.S. PATENT DOCUMENTS

| | | | | |
|---|---|---|---|---|
| 4,585,537 A | * | 4/1986 | Nakayama et al. | 427/570 |
| 5,423,970 A | * | 6/1995 | Kugler | 204/298.03 |
| 5,895,723 A | | 4/1999 | Gesellschaft | |
| 2003/0228475 A1 | | 12/2003 | Komada | |
| 2006/0093758 A1 | * | 5/2006 | Sakakura et al. | 428/1.6 |
| 2008/0008893 A1 | | 1/2008 | Bright | |

FOREIGN PATENT DOCUMENTS

| | | |
|---|---|---|
| DE | 4328767 | 3/1995 |
| DE | 19917076 A1 | 10/2000 |
| DE | 19935181 A1 | 2/2001 |
| JP | 2006044130 A | 2/2006 |
| WO | WO 02/02315 A1 | 1/2002 |

OTHER PUBLICATIONS

Extended European Search Report mailed Mar. 23, 2009; Application No. 08155403.2, 6 pages.

* cited by examiner

*Primary Examiner* — Keith Hendricks
*Assistant Examiner* — Jason M Berman
(74) *Attorney, Agent, or Firm* — Kilpatrick, Townsend & Stockton LLP

(57) ABSTRACT

The present invention refers to a coating device for depositing of barrier layers on a plastic substrate comprising a first coating station for depositing a first layer comprising a metal and a second coating station for depositing a second layer comprising a resin, wherein a treatment station for treating the deposited first layer is arranged between the first and the second coating stations which comprises sputter means for depositing one or several atomic layers or isles of deposition material. The invention further refers to an appropriate method which can be carried out by the coating device and to a layer system produced thereby.

21 Claims, 2 Drawing Sheets

Figure 1:
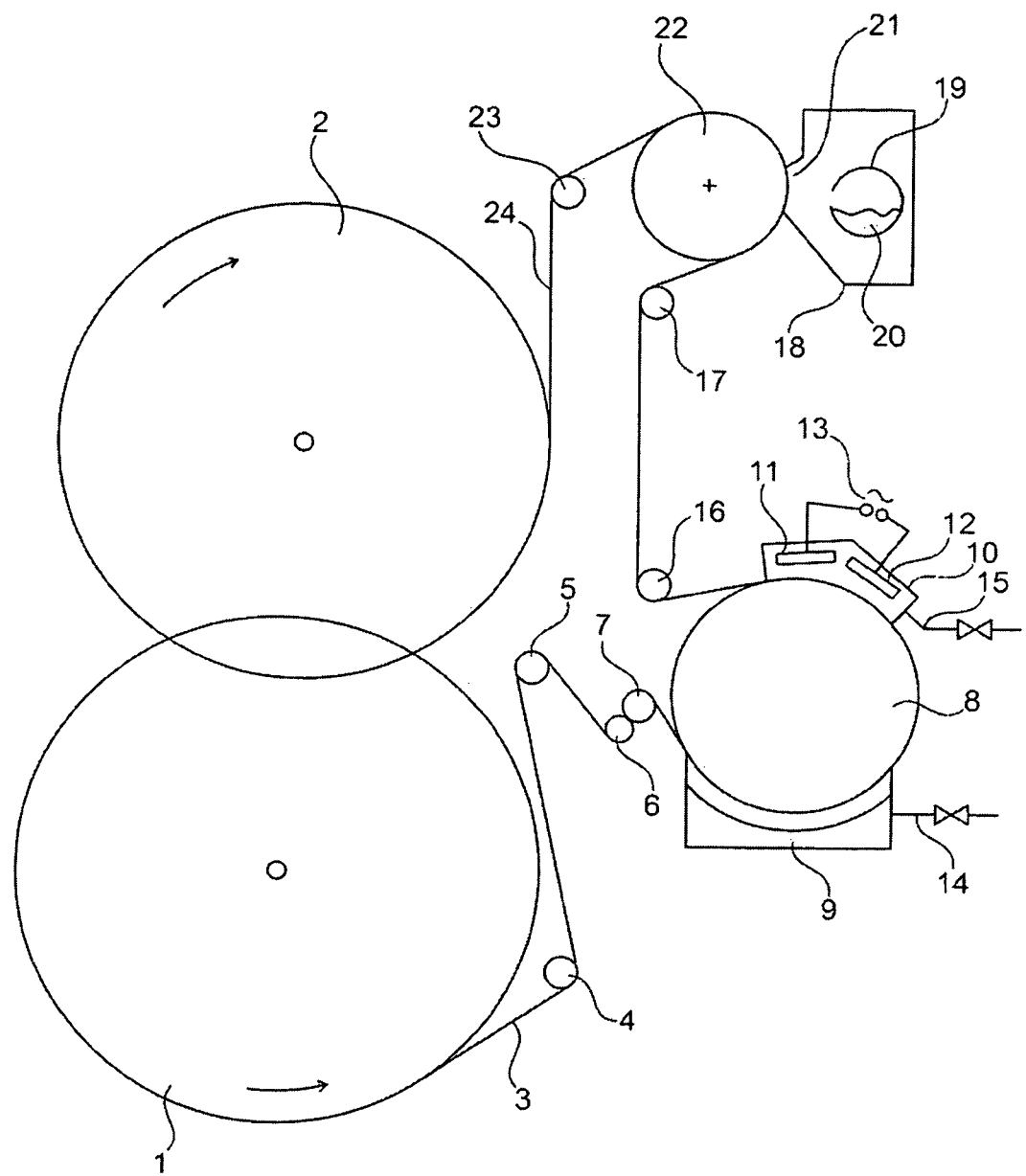

METHOD FOR DEPOSITING OF BARRIER LAYERS ON A PLASTIC SUBSTRATE AS WELL AS COATING DEVICE THEREFOR AND A LAYER SYSTEM

CROSS-REFERENCES TO RELATED APPLICATIONS

This application claims priority to U.S. Provisional Patent Application No. 61/042,387, filed on Apr. 4, 2008, entitled "METHOD FOR DEPOSITING OF BARRIER LAYERS ON A PLASTIC SUBSTRATE AS WELL AS COATING DEVICE THEREFOR AND A LAYER SYSTEM," the disclosure of which is herein incorporated by reference for all purposes.

This application also claims the benefit of European Patent Application No. EP08103386.2, filed on Apr. 4, 2008, and European Patent Application No. EP08155403.2, filed on Apr. 29, 2008, each of which are incorporated by reference herein for all purposes.

BACKGROUND OF THE INVENTION

1. Field of the Invention

The present invention refers to a method for depositing of barrier layers on a plastic substrate comprising a first coating step for depositing a first barrier layer comprising a metal and a second coating step for depositing a second barrier layer comprising a resin and relates to a coating device for carrying out such a method as well as to a layer system produced by this method.

2. Prior Art

Composite foils made from plastic substrates and barrier layers deposited thereon for preventing moisture and oxygen passing the composite foil are known in packaging industries for packing food, chemical goods, and pharmaceuticals as well as technical or other agricultural products. In order to protect the packed goods from moisture and oxygen which might cause environmental degradation of the products, different layer systems forming the composite foil are used. Examples are given in WO 02/02315 A1, DE 43 28 767 A1, DE 199 351 81 A1, DE 199 170 76 A1 or JP 2006044130 A. One commonly used layer system comprises a plastic foil as a substrate onto which a first barrier layer made of aluminium or aluminium oxide is deposited. On the first barrier layer a second barrier layer is provided for. The second barrier layer is made of a melamine resin. Both barrier layers may be deposited at the surface of the plastic foil by evaporation processes. However, although such a layer system comprises good protection for the goods packed by such a foil with respect to moisture and oxygen, pure adhesion of the melamine resin on the aluminium or alumina layer is a serious drawback.

DISCLOSURE OF THE INVENTION

Object of the Invention

Therefore, it is an object of the present invention to improve adhesion of melamine resin on an aluminium or alumina barrier layer on a plastic foil. Generally, it is an object of the present invention to provide a method as well as a coating device for coating of a plastic substrate with barrier layers which have a good adhesion as well as a good volume resistance against moisture and oxygen. Moreover, an appropriate layer system should be provided for. In addition, the coating device should be simple to use and to manufacture and the method should be easy to be carried out.

Technical Solution

The above-mentioned objects are solved by a coating device having the features of claim 1 as well as a method having the features of claim 23 as well as a layer system with the features of claim 42. Preferred embodiments are subject matter of the dependent claims.

The present invention is based oil the finding that the adhesion of a second barrier layer comprising a resin on a first barrier layer comprising a metal can be significantly improved by arranging an adhesive layer between the first and the second barrier layer. The adhesive layer according to the present invention comprises only one or several atomic layers or isles of deposition material which is deposited by a sputter process. Thus, according to the present invention the expression adhesive layer comprises a very thin continuous layer as well as a non-continuous layer having only spread parts of a layer in form of separate isles.

The material used for depositing an adhesive layer can be chosen from silicon, silicon oxide, especially non-stoichiometric $SiO_x$, iron, steel, stainless steel, chromium, nickel, vanadium as well as alloys and oxides thereof. The deposition of such materials in only one or several atomic layers as well as in discrete agglomerations in form of isles leads to a significant improvement in adhesion while the other properties and especially the barrier function are maintained. The expression several or a few atomic layers means that there are only 2 to 20, especially 5 to 50, particularly about 10 rows of atoms or molecules one upon the other. The amount of deposited material can be as less that not even a complete continuous layer is deposited, but only discrete material isles are present in the first and the second barrier layer.

Such thin adhesive layer can be deposited by continuously moving the substrate during the deposition process. Accordingly, the deposition rate and the transport velocity at which the substrate to be deposited is moved over the sputter source, the amount of deposited material can be adapted. However, stationary deposition during which the substrate is not moved is also possible.

The inventive method of depositing a thin adhesive layer between the first and second barrier layer can be applied to a rigid plastic material or a flexible plastic material. Preferably, the invention is used for flexible plastic foils which can be used in packaging industries. Accordingly, the substrate can be a flexible plastic foil in form of a rollable band which can be processes in a web coating device. Such a web coating device may comprise two winding rolls for unwinding and winding the uncoated plastic foil or the coated plastic foil, respectively. Along the transport path from the unwinding roll to the winding roll a first coating station for depositing the first barrier layer, the second coating station for depositing the second coating layer and a treatment station for sputter depositing the adhesive layer may be located.

For the dynamic coating processes as well as for the treatment process, during which the substrate is moved, the speed of the substrate may be set to be between 0,1-20 m/s, especially 3-14 m/s and particularly 5 to 11 m/s. Due to this velocity of the substrate appropriate sputter conditions may be set to achieve the required deposition of a thin adhesive layer.

The first coating step may be an evaporation step during which a metal is evaporated and coated to the surface of the plastic material. The evaporation may be carried out by a thermal evaporation so that the first coating station for carrying out the first coating step may comprise thermal evaporation means. However, other evaporation means like electron beam evaporation means or means for combined processes like electron beam evaporation and hollow cathode arc activated deposition (HAD process) are conceivable. In addition, it is also possible to carry out a reactive evaporation, for example by providing gas supply means for supplying reactive gas to the evaporation process.

The second coating step for depositing a second barrier coating may also be carried out by evaporation. Accordingly, thermal evaporation means for evaporation of resins and especially melamine resins may be provided for the second coating station.

As mentioned before, the adhesive layer or partial adhesive layer is deposited in a treatment station by a sputter process. For this purpose, the treatment station may comprise sputter means having at least one cathode, e.g a rotatable cathode, especially a planar cathode. The cathode may comprise a target to be sputtered in front of the cathode or the target is used as the cathode. The at least one cathode may be a magnetron cathode which allows an higher sputter yield due to improved atomisation of the target material caused by the magnetic field of the magnets of the magnetron so as to allow to perform the sputter process at a higher deposition rate.

Preferably, the sputter means may comprise a so-called "twin mag" arrangement in which two magnetron electrodes are alternatively operated as cathode. However, such a twin electrode arrangement may also use electrodes without magnets, but only plain electrodes, especially planar electrodes.

The frequency by which the electrodes are switched from a cathode to an anode and vice versa may be set in the range of 1 kHz to 1 MHz, especially 10 kHz to 100 kHz and preferably 30 kHz to 50 kHz. However, instead of an AC power supply a DC power supply or pulsed DC may also be used.

By carrying out the inventive method a layer system, also designated as composite foil, comprising a plastic substrate layer, a first barrier layer comprising a metal and a second barrier layer comprising a resin as well as an adhesive inter layer between the first barrier layer and the second barrier layer can be produced. The adhesive layer may comprise only one or several atomic layers of the sputter deposited material like steel, stainless steel, chromium, iron, nickel, vanadium, silicon and oxides as well as alloys thereof. Instead of a continuous adhesive layer it is also possible to only deposit distinct and separate isles of material between the first barrier layer and the second barrier layer.

Such a layer system may be combined with other layers, for example a top layer made of another plastic foil or the like.

SHORT DESCRIPTION OF THE FIGURES

Figure 2:
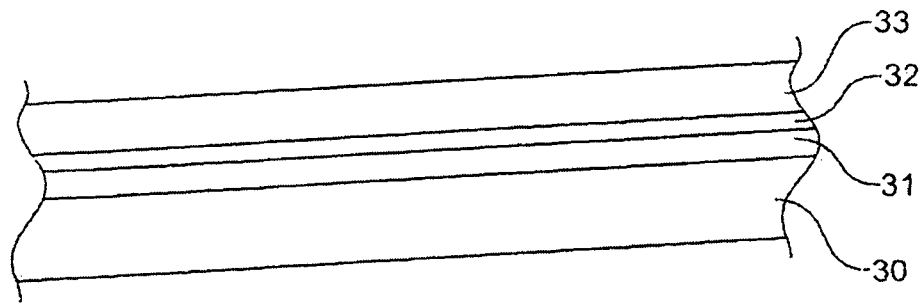
Figure 3:
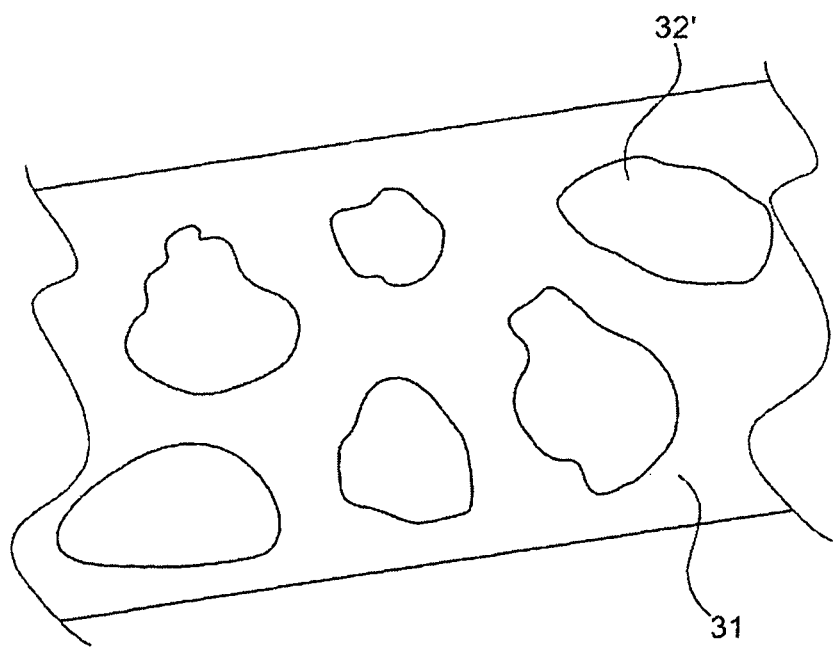

Further advantages, characteristics and features of the present invention will become apparent from the following detailed description of preferred embodiments with respect to the attached drawings. The drawings show in purely schematic form in FIG. 1 a side view of a coating device according to an embodiment of the present invention;

FIG. 2 a cross section of a band having a layer system according to the present invention; and in FIG. 3 a top view onto the first barrier layer and the adhesive layer deposited thereon.

FIG. 1 shows in a purely schematic form a coating device which can be used to produce a layer system according to the present invention as well as for carrying out the inventive method.

FIG. 1 shows a web coating device for coating of a flexible plastic foil in form of a rollable band. Instead of flexible plastic materials it is also conceivable to coat rigid substrates. For such substrates only the transport path has to be amended while the coating stations as well as the treatment station as described below can also be used for rigid substrates.

According to the embodiment shown in FIG. 1, the coating device comprises a first winding roll 1 for unwinding the plastic foil 3 to be coated from a coil. The plastic foil 3 or band is guided over several guide rollers 4, 5, 6 and 7 to be received by a first process roll 8. At the process roll 8 a first coating station 9 and a treatment station 10 are arranged.

The first coating station 9 comprises an evaporator by which a metal, like aluminium can be evaporated. In addition, the first coating station 9 comprises a gas supply 14 by which reactive gas, e.g. oxygen, for carrying out reactive evaporation can be supplied to the first coating station 9. During operation of the coating device a metal, for example aluminium, may be evaporated in the first coating station while the band or plastic foil 3 is moved over the first process roll 8 and is therefore passed along the first coating station 9. During passing the first coating station 9 the evaporated metal is deposited onto the plastic foil 3 in order to form a first barrier layer made of aluminium, for example. If during the evaporation process oxygen gas is introduced in the first coating station, aluminium oxide (alumina) $Al_2O_3$ or $AlO_x$ may be deposited on the plastic foil as an alternative first barrier layer.

After the first coating station 9 the plastic foil 3 moving along the process roll 8 is passing the treatment station 10 where a sputter deposition process is carried out. For this purpose, the treatment station comprises a so-called "twin mag" electrode arrangement having two electrodes 11 and 12 which are alternatively operated as cathode and anode. Accordingly, the electrodes 11 and 12 are connected to a power supply 13 providing AC voltage with a frequency of 40 kHz. The electrodes 11 and 12 are preferably planar electrodes extending with their length extension across the transport direction of the plastic foil 3. The electrodes 11 and 12 comprise a sputter target which is atomized in order to produce material to be deposited onto the plastic foil 3. The target may be arranged in front of the electrodes 11, 12 or may itself form the electrode. Furthermore, the electrodes 11, 12 may be designed as magnetrons comprising a magnet arrangement (not shown) at the side opposite to the sputter target in order to enhance production of ions in the plasma to be accelerated to the target. Thus, the sputter yield can be improved.

The treatment station also comprises a gas supply 15 which allows supplying reactive gases for reactive sputtering. However, instead of reactive sputtering, for example sputtering of a metal target in the presence of oxygen, the oxides itself, like silicon oxide $SiO_x$ or similar, may be sputtered directly.

After leaving the treatment station 10, the plastic foil 3 comprising the first barrier layer and one or a view atomic layers of the sputter deposited material is guided over the guide rollers 16 and 17 to a second process roll 22.

At the second process roll 22, which is similar to the first process roll 8 and can also be designated as coating roll, the second coating station 18 is arranged. The second coating station 18 comprises evaporation means for evaporation of a melamine resin 20 which is contained in a heatable pipe 19 the ends of which are closed in order to avoid loss of the melamine resin 20. However, the pipe 19 comprises a slit extending along the length direction of the pipe and across the transport direction of the plastic foil 3 so that after heating of the pipe 19 to a temperature of about 200 to 300° C. the vapor of the melamine resin can leave the pipe 19. Since the slit in the pipe 19 is directed towards the process roll 22 along which the plastic foil to be coated is transported, the melamine vapor may pass through the opening 21 of the housing of the second coating station 18 and arrive at the pre-coated plastic foil 3 in order to create a second barrier layer comprising melamine resin. After leaving the area of the second coating station 18, the plastic foil 3 is guided by the guide roller 23 to the winding roll 2 which is winding the completely coated plastic foil 24 into a coil.

Since the coating processes at the first coating station 9 and the second coating station 18 as well as the sputter process carried out at the treatment station 10 are processes which are carried out wider vacuum conditions, the whole device is incorporated in a vacuum-tight housing which is not shown in FIG. 1 for the sake of simplicity.

With the coating device shown in FIG. 1 it is possible to carry out the inventive method, since in the first coating station 9 a deposition of a first barrier coating consisting of a metal layer, like aluminium, or a metal oxide layer, like aluminium oxide, is possible.

In the following step at the treatment station 10 a very thin layer of an adhesive layer may be deposited by a sputter technology. Especially, high frequency sputter deposition using two electrodes which are alternatively switched as cathodes and anodes can be performed at frequencies from 1 kHz to 1 MHz, especially 10 kHz to 100 kHz and more preferably 30 kHz to 50 kHz, especially about 40 kHz. As target materials silicon or metals or metal alloys as well as oxides thereof may be used. For example, chromium, vanadium, nickel, iron, steel or stainless steel may be used as a target material. With respect to oxides, Si reactive sputtering can especially be used. Moreover, it is possible to use metal targets or silicon targets under an atmosphere containing oxygen so that reactive sputtering is performed. The sputtering is carried out in a way that only one atomic layer of the material to be deposited or only a few layers, like 2 to 20 or 5 to 15 atomic layers may be deposited onto the first barrier layer which is already present at the substrate. Moreover, it is possible to deposit less material as would be necessary to form a continuous adhesive layer. In this case, instead of a continuous adhesive layer, isles of an adhesive layer or separate conglomerates of deposition material can be arranged on the first barrier layer.

This is schematically shown in FIGS. 2 and 3.

FIG. 2 shows a cross section through the completely processed plastic foil with the plastic substrate 30, the first barrier layer 31, the adhesive layer 32 and the second barrier layer 33. Accordingly, a layer system shown in FIG. 2 may comprise a polyethylene or polyethylene terephthalate as well as polypropylene or biaxial oriented polypropylene substrate 30 onto which an aluminium or alumina layer 31 as the first barrier layer is deposited. On the first barrier layer 31 a continuous adhesive layer 32, as shown in FIG. 2, or separate isles of adhesive layer material 32' are provided for.

The adhesive layer 32 or 32' improves the adhesion of the second barrier layer 33 on the first barrier layer wherein the second barrier layer is preferably a melamine resin.

Although the present invention has been described in detail with respect to the embodiments, it is evident for a man skilled in the art that the invention is not restricted to the described embodiments, but covers also amendments and alterations falling within the scope of the claims. Especially, the invention covers all possible combinations of single features described herein and especially embodiments with different combinations of features or embodiments where single features are omitted.

What is claimed is:

1. A method for depositing barrier layers on a plastic substrate, the method comprising the steps thereof:

a first coating step for depositing a first layer comprising a metal;

a second coating step for depositing a second layer comprising a resin; and a treatment step carried out between the first and the second coating steps for treating the deposited first layer, wherein the treatment step comprises sputtering of one or two atomic layers or of separate isles of deposition material onto the substrate.

2. The method according to claim 1, wherein the substrate is continuously moved during at least one of the first and the second coating steps and the treatment step.

3. The method according to claim 1, wherein a moving speed of the substrate is substantially between 0.1 and 20 meters per second during the treatment step.

4. The method according to claim 1, wherein a moving speed of the substrate is substantially between 3 and 14 meters per second during the treatment step.

5. The method according to claim 1, wherein a moving speed of the substrate is substantially between 5 and 11 meters per second during the treatment step.

6. The method according to claim 1, wherein the substrate comprises a flexible plastic foil in a form of a rollable band.

7. The method according to claim 1, wherein the substrate comprises a material selected from the group consisting of polyethylene PE, polyethylene terephthalate PET, biaxial oriented polypropylene BOPP, polypropylene PP, and acetate.

8. The method according to claim 1, wherein the first coating step comprises evaporating a metal.

9. The method according to claim 1, wherein the first coating step comprises carrying out a process selected from the group consisting of hollow cathode arc activated deposition (HAD process) and reactive evaporation.

10. The method according to claim 1, wherein the first coating step comprises depositing a material selected from the group consisting of aluminum or alumina.

11. The method according to claim 1, wherein the second coating step comprises depositing a melamine resin.

12. The method according to claim 1, wherein the sputtering comprises using an AC voltage at a cathode, wherein a frequency of the AC voltage is set substantially between 1 kHz and 1 MHz.

13. The method according to claim 1, wherein the sputtering comprises using a DC voltage at a cathode.

14. The method according to claim 12, wherein the frequency is set substantially between 10 kHz and 100 kHz.

15. The method according to claim 12, wherein the frequency is set substantially between 30 kHz and 50 kHz.

16. The method according to claim 1, wherein the treatment step comprises depositing at least one component selected from the group consisting of steel, stainless steel, chromium, iron, nickel, vanadium, silicon, and oxides.

17. The method according to claim 1, wherein the treatment step comprises reactive sputtering.

18. The method according to claim 1, further comprising performing the steps under vacuum conditions.

19. The method according to claim 1, further comprising using a coating device for depositing barrier layers on the plastic substrate, wherein the coating device comprises:

a first coating station for depositing the first layer comprising the metal;

a second coating station for depositing the second layer comprising the resin; and a treatment station arranged between the first and the second coating stations for treating the deposited first layer, wherein the treatment station comprises sputter means for depositing one or several atomic layers or isles of deposition material.

20. A method for depositing barrier layers on a plastic substrate, the method comprising the steps thereof:
   a first coating step for depositing a first layer comprising a metal;
   a second coating step for depositing a second layer comprising a resin; and
   a treatment step carried out between the first and the second coating steps for treating the deposited layer, wherein the treatment step comprises sputtering of one to twenty atomic layers or separate isles of deposition material onto the substrate using sputtering means, wherein the sputtering means contains two electrodes which are alternately operated as a cathode.

21. The method according to claim 20, wherein the electrodes are magnetron electrodes or plain electrodes.

* * * * *